(12) United States Patent
Delling et al.

(10) Patent No.: US 8,738,559 B2
(45) Date of Patent: May 27, 2014

(54) GRAPH PARTITIONING WITH NATURAL CUTS

(75) Inventors: Daniel Delling, Mountain View, CA (US); Andrew V. Goldberg, Redwood City, CA (US); Ilya Razenshteyn, Nizhniy Novgorod (RU); Renato F. Werneck, San Francisco, CA (US)

(73) Assignee: Microsoft Corporation, Redmond, WA (US)

( * ) Notice: Subject to any disclaimer, the term of this patent is extended or adjusted under 35 U.S.C. 154(b) by 272 days.

(21) Appl. No.: 13/011,940

(22) Filed: Jan. 24, 2011

(65) Prior Publication Data

US 2012/0192138 A1 Jul. 26, 2012

(51) Int. Cl.
*G06F 17/00* (2006.01)
*G06N 5/02* (2006.01)

(52) U.S. Cl.
USPC ............................ 706/46; 701/400; 701/532

(58) Field of Classification Search
USPC ............................ 706/46; 701/532, 400, 410
See application file for complete search history.

(56) References Cited

U.S. PATENT DOCUMENTS

| | | | |
|---|---|---|---|
| 5,748,844 A | 5/1998 | Marks | |
| 6,016,485 A * | 1/2000 | Amakawa et al. | 705/400 |
| 6,594,624 B1 | 7/2003 | Curet | |
| 7,676,781 B1 * | 3/2010 | Salowe | 716/126 |
| 7,788,210 B2 | 8/2010 | Lang et al. | |
| 2004/0248576 A1 | 12/2004 | Ghiglino et al. | |
| 2005/0187711 A1 * | 8/2005 | Agrawala et al. | 701/211 |
| 2005/0216182 A1 * | 9/2005 | Hussain et al. | 701/200 |
| 2006/0002609 A1 * | 1/2006 | Casadei | 382/226 |
| 2007/0220522 A1 * | 9/2007 | Coene et al. | 718/104 |
| 2010/0325621 A1 * | 12/2010 | Andrade et al. | 717/156 |

OTHER PUBLICATIONS

Route Planning in Road Networks by Dominik Schultes, Feb. 2008.*
Creating Graph Partitions for Fast Optimum Route Planning by Ingrid Flinsenberg, 2004.*
Engineering Route Planning Algorithms by Delling et al., published 2009.*
Maintaining Bridge-Connected and Biconnected Components On-Line, by Westbrook et al., published 1992.*
Patkar, et al., "A Graph Partitioning System for Natural Unbalanced Partitions", Retrieved at << http://www.ics.uci.edu/~bhore/papers/graph-partitioning.pdf >>, In Proceeding of WSEAS International Conference on Information and Automation, 2002, pp. 1-6.
Chamberlain, Bradford L., "Graph Partitioning Algorithms for Distributing Workloads of Parallel Computations", Retrieved at << http://www.cs.washington.edu/homes/brad/cv/pubs/degree/generals.pdf >>, Oct. 13, 1998, pp. 1-32.

(Continued)

*Primary Examiner* — Alan Chen
*Assistant Examiner* — Thomas Fink
(74) *Attorney, Agent, or Firm* — Micah Goldsmith; Glen Johnson; Micky Minhas

(57) ABSTRACT

Graph partitioning techniques are based on the notion of natural cuts. A filtering phase performs a series of minimum cut computations to identify and contract dense regions of the graph. This reduces the graph size significantly, but preserves its general structure. An assembly phase uses a combination of greedy and local search heuristics to assemble the final partition. The techniques may be used on road networks, which have an abundance of natural cuts (such as bridges, mountain passes, and ferries).

15 Claims, 7 Drawing Sheets

(56) References Cited

OTHER PUBLICATIONS

Khandekar, et al., "Graph Partitioning Using Single Commodity Flows", Retrieved at << http://www.cse.iitd.ernet.in/~rohitk/research/partitioning-STOC06.pdf >>, Symposium on Theory of Computing Conference, May 21-23, 2006, pp. 6.

Idwan, et al., "Computing Breadth First Search in Large Graph Using hMetis Partitioning", Retrieved at << http://www.eurojournals.com/ejsr_29_2_08.pdf >>, European Journal of Scientific Research, vol. 29, No. 2, Apr. 2009, pp. 215-221.

Arora, et al., "Geometry, Flows, and Graph-Partitioning Algorithms", Retrieved at << http://citeseerx.ist.psu.edu/viewdoc/download?doi=10.1.1.160.4684&rep=rep1&type=pdf >>, Communications of the ACM, vol. 51, No. 10, Oct. 2008, pp. 96-105.

Jain, et al., "Greedy Algorithms for K-Way Graph Partitioning", Retrieved at << http://citeseerx.ist.psu.edu/viewdoc/download?doi=10.1.1.33.2104&rep=rep1&type=pdf >>, 2007, pp. 1-8.

Lang, et al., "Finding Dense and Isolated Submarkets in a Sponsored Search Spending Graph", Retrieved at << http://research.yahoo.com/files/cikm636-langk.pdf >>, Conference on Information and Knowledge Management, Nov. 6-8, 2007, pp. 10.

Gonzalez, et al., "Adaptive Fastest Path Computation on a Road Network: A Traffic Mining Approach", Retrieved at << http://www.vldb.org/conf/2007/papers/research/p794-gonzalez.pdf >>, Proceedings of the 33rd International Conference on Very Large Data Bases, Sep. 23-28, 2007, pp. 794-805.

Bhatt, et al., "A Framework for Solving VLSI Graph Layout Problems", Retrieved at << http://citeseerx.ist.psu.edu/viewdoc/download?doi=10.1.1.17.3685&rep=rep1&type=pdf >>, Journal of Computer and System Sciences, 1984, pp. 46.

Kwatra, et al., "Graphcut Textures: Image and Video Synthesis using Graph Cuts", Retrieved at << http://citeseerx.ist.psu.edu/viewdoc/download?doi=10.1.1.9.1442&rep=rep1&type=pdf >>, Special Interest Group on Computer Graphics and Interactive Techniques, Jul. 27-31, 2003, pp. 10.

Wu, et al., "An Optimal Graph Theoretic Approach to Data Clustering: Theory and its Application to Image Segmentation", Retrieved at << http://www.dis.uniroma1.it/~sassano/STAGE/Image.pdf >>, IEEE Transactions on Pattern Analysis and Machine Intelligence, vol. 15, No. 11, Nov. 1993, pp. 1101-1113.

Delling, et al., "Engineering Route Planning Algorithms", Retrieved at << http://citeseerx.ist.psu.edu/viewdoc/download?doi=10.1.1.164.8916&rep=rep1&type=pdf >>, Algorithmics of Large and Complex Networks Lecture Notes in Computer Science, 2009, pp. 117-139.

Schloegel, et al., "Graph Partitioning for High-Performance Scientific Simulations", Retrieved at << http://citeseerx.ist.psu.edu/viewdoc/download?doi=10.1.1.43.1206&rep=rep1&type=pdf >>, 2000, pp. 40.

Walshaw, et al., "JOSTLE: Parallel Multilevel Graph-Partitioning Software—An Overview," in Mesh Partitioning Techniques and Domain Decomposition Techniques, Retrieved at << http://staffweb.cms.gre.ac.uk/~c.walshaw/papers/fulltext/WalshawMPDD07.pdf >>, 2007, pp. 1-32.

Karypis, et al., "A Fast and High Quality Multilevel Scheme for Partitioning Irregular Graphs", Retrieved at << http://citeseerx.ist.psu.edu/viewdoc/download?doi=10.1.1.39.3415&rep=rep1&type=pdf >>, SIAM Journal on Scientific Computing, vol. 20, No. 1, Aug. 1998, pp. 1-28.

Meyerhenke, et al., "A New Diffusion-Based Multilevel Algorithm for Computing Graph Partitions of Very High Quality", Retrieved at << http://aeolus.ceid.upatras.gr/scientific-reports/3rd_year_reports/upb-ipdps08.pdf >>, IEEE International Symposium on Parallel and Distributed Processing, Apr. 14-18, 2008, pp. 13.

Hendrickson, et al., "A Multilevel Algorithm for Partitioning Graphs", Retrieved at << http://citeseerx.ist.psu.edu/viewdoc/download?doi=10.1.1.74.7235&rep=rep1&type=pdf >>, Proceedings of the IEEE/ACM SC95 Conference Supercomputing, 1995, pp. 1-14.

Preis, et al., "The PARTY Partitioning Library, User Guide", Retrieved at << http://citeseerx.ist.psu.edu/viewdoc/download?doi=10.1.1.33.3018&rep=rep1&type=pdf >>, Version 1.1, 1996, pp. 1-29.

Holtgrewe, et al., "Engineering a Scalable High Quality Graph Partitioner", Retrieved at << http://arxiv.org/PS_cache/arxiv/pdf/0910/0910.2004v2.pdf >>, Technical Report, 2009, pp. 1-27.

Osipov, et al., "n-Level Graph Partitioning", Retrieved at << http://arxiv.org/PS_cache/arxiv/pdf/1004/1004.4024v1.pdf >>, 18th European Symposium on Algorithms, 2010, pp. 1-19.

Köhler, et al., "Fast Point-to-Point Shortest Path Computations with Arc-Flags", Retrieved at << http://citeseerx.ist.psu.edu/viewdoc/download?doi=10.1.1.101.3778&rep=rep1&type=pdf >>, in 9th DIMACS Implementation Challenge, 2006, pp. 1-27.

Maue, et al., "Goal-Directed Shortest-Path Queries Using Precomputed Cluster Distances", Retrieved at << http://algo2.iti.kit.edu/documents/MaueSandersMatijevic2009.pdf >>, Journal of Experimental Algorithmics (JEA), vol. 14, Dec. 2009, pp. 1-27.

Delling, et al., "High-Performance Multi-Level Routing", Retrieved at << http://citeseerx.ist.psu.edu/viewdoc/download?doi=10.1.1.164.1375&rep=rep1&type=pdf >>, DIMACS Series in Discrete Mathematics and Theoretical Computer Science, 2008, pp. 1-19.

Kieritz, et al., "Distributed Time-Dependent Contraction Hierarchies", Retrieved at << http://algo2.iti.kit.edu/download/dtch.pdf >>, Experimental Algorithms, 9th International Symposium, May 20-22, 2010, pp. 1-11.

Goldberg, et al., "Reach for A: Shortest Path Algorithms with Preprocessing", Retrieved at << http://www.avglab.com/andrew/pub/ch9Book.pdf >>, In The Shortest Path Problem: Ninth DIMACS Implementation Challenge, 2009, pp. 1-47.

Fiduccia, et al., "A Linear-Time Heuristic for Improving Network Partitions", Retrieved at << http://www.eecs.umich.edu/~mazum/fmcut1.pd >>, 40th Annual Design Automation Conference, Jun. 2-6, 2003, pp. 175-181.

Kernighan, et al., "An Efficient Heuristic Procedure for Partitioning Graphs", Retrieved at << http://www.cs.princeton.edu/~bwk/btl.mirror/new/partitioning.pdf >>, The Bell system technical journal, vol. 49, No. 1, 1969, pp. 291-307.

Andersen, et al., "An Algorithm for Improving Graph Partitions", Retrieved at << http://research.yahoo.com/files/p651-andersen.pdf >>, 19th ACM-SIAM Symposium on Discrete Algorithms, Jan. 20-22, 2008, pp. 651-660.

Boykov, et al., "Fast Approximate Energy Minimization via Graph Cuts", Retrieved at << http://www.cs.cornell.edu/rdz/Papers/BVZ-iccv99.pdf >>, IEEE Transactions on Pattern Analysis and Machine Intelligence, vol. 23, No. 11, Nov. 2001, pp. 8.

Pritchard, et al., "Fast Computation of Small Cuts via Cycle Space Sampling", Retrieved at << http://sma.epfl.ch/~pritchar/math/2008/random-circ-jour.pdf >>, Sep. 1, 2009, pp. 1-26.

Goldberg, et al., "A New Approach to the Maximum Flow Problem", Retrieved at << http://citeseerx.ist.psu.edu/viewdoc/download?doi=10.1.1.91.1599&rep=rep1&type=pdf >>, Journal of the Association for Computing Machinery, vol. 35, No. 4, Oct. 1988, pp. 921-940.

"The Graph Partitioning Archive", Retrieved at << http://staffweb.cms.gre.ac.uk/~c.walshaw/partition/ >>, Retrieved Date: Oct. 27, 2010, pp. 16.

Pellegrini, et al., "SCOTCH: A Software Package for Static Mapping by Dual Recursive Bipartitioning of Process and Architecture Graphs", In High-Performance Computing and Networking, ser. Lecture Notes in Computer Science. Springer, 1996, pp. 493-498.

\* cited by examiner

GRAPH PARTITIONING WITH NATURAL CUTS

BACKGROUND

Graph partitioning is a well known classical problem with many applications. For example, graph partitioning may be used with applications on road networks that include distributed preprocessing of routing information, real-time traffic route planning, and metric-independent route planning, as well as other applications that are unrelated to route planning. Known software libraries (e.g., METIS, SCOTCH, JOSTLE, etc.) solve the problem but the quality of the obtained solutions is often unacceptable on road networks.

More particularly, partitioning a graph into many well-separated cells is a fundamental problem in computer science with applications in areas such as VLSI design, computer vision, image analysis, distributed computing, and route planning. Most variants of this problem are known to be NP-hard (non-deterministic polynomial-time hard) and focus on minimizing the number of edges linking vertices from different cells (the "cut size"). There is much literature on the problem, including many heuristic solutions.

A popular approach is multilevel graph partitioning (MGP), which generally works in three phases. During the first phase, the graph is iteratively shrunk by contracting edges. This is repeated until the number of remaining vertices is small enough to perform an expensive initial partitioning (the second phase of MGP). At the third phase, the graph is partially uncontracted, and local search is applied to improve the cut size.

Although MGP approaches can be used for road networks, they do not exploit the natural properties of such networks in full. In particular, road networks are not uniform: there are densely populated regions (which should not be split) close to natural separators like bridges, mountain passes, and ferries. Moreover, known MGPs focus on balancing the sizes of the cells while sacrificing either connectivity or cut size. This makes sense for more uniform graphs, such as meshes. However, many road network applications use cells that are connected and one does not want to sacrifice the cut size. Such applications include route planning, distribution of data, and computation of centrality measures.

SUMMARY

In an implementation, partitioning is tailored to graphs, such as road networks, that contain natural cuts (i.e., relatively sparse cuts close to denser areas), and comprises two phases. One phase, referred to as filtering, reduces the size of the graph while preserving its overall structure. A second phase, referred to as assembly, builds a partition.

In an implementation, the filtering keeps the edges that appear in natural cuts and contracts other edges. The filtering performs a series of minimum cut computations to identify and contract dense regions of the graph. Minimum cuts are computed between chosen regions of the graph. Edges that do not contribute to a natural cut are contracted, reducing the graph size. Despite being much smaller, the contracted graph preserves the natural cuts.

In an implementation, the assembly uses a combination of greedy and local search heuristics to assemble the final partition. The assembly only tries to combine fragments (the contracted vertices). Individual fragments are not disassembled.

This summary is provided to introduce a selection of concepts in a simplified form that are further described below in the detailed description. This summary is not intended to identify key features or essential features of the claimed subject matter, nor is it intended to be used to limit the scope of the claimed subject matter.

BRIEF DESCRIPTION OF THE DRAWINGS

The foregoing summary, as well as the following detailed description of illustrative embodiments, is better understood when read in conjunction with the appended drawings. For the purpose of illustrating the embodiments, there are shown in the drawings example constructions of the embodiments; however, the embodiments are not limited to the specific methods and instrumentalities disclosed. In the drawings.

DETAILED DESCRIPTION

Figure 1:
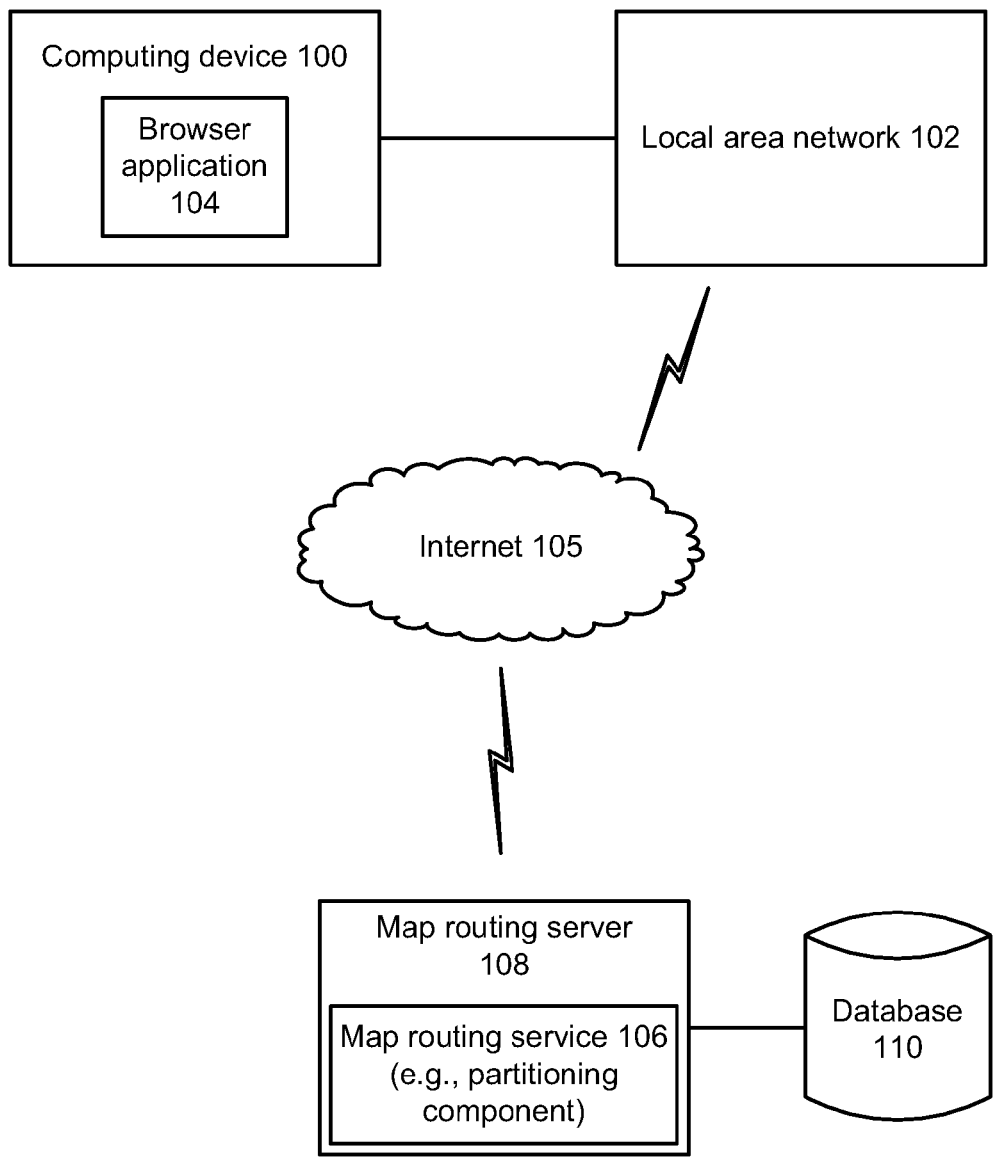
FIG. 1 shows an example of a computing environment in which aspects and embodiments may be potentially exploited.

FIG. 1 shows an example of a computing environment in which aspects and embodiments may be potentially exploited. A computing device 100 includes a network interface card (not specifically shown) facilitating communications over a communications medium. Example computing devices include personal computers (PCs), mobile communication devices, etc. In some implementations, the computing device 100 may include a desktop personal computer, workstation, laptop, PDA (personal digital assistant), cell phone, or any WAP-enabled device or any other computing device capable of interfacing directly or indirectly with a network. An example computing device 100 is described with respect to the computing device 800 of FIG. 8, for example.

The computing device 100 may communicate with a local area network 102 via a physical connection. Alternatively, the computing device 100 may communicate with the local area network 102 via a wireless wide area network or wireless local area network media, or via other communications media. Although shown as a local area network 102, the network may be a variety of network types including the public switched telephone network (PSTN), a cellular telephone network (e.g., 3G, 4G, CDMA, etc), and a packet switched network (e.g., the Internet). Any type of network and/or network interface may be used for the network.

The user of the computing device 100, as a result of the supported network medium, is able to access network resources, typically through the use of a browser application 104 running on the computing device 100. The browser application 104 facilitates communication with a remote network over, for example, the Internet 105. One exemplary network resource is a map routing service 106 (or a partitioning component that can perform the operations and techniques described herein), running on a map routing server 108. The map routing server 108 hosts a database 110 of physical locations and street addresses, along with routing information such as adjacencies, distances, speed limits, and other relationships between the stored locations.

A user of the computing device 100 typically enters a query request through the browser application 104. The query request may include a start location (and/or other location, like a destination location, and/or other information like a request for a particular type of establishment like restaurants or pharmacies, for example). The map routing server 108 receives the request and produces output data (e.g., various routes, attractions, data items, locations, identifiers of nearby establishments like restaurants or pharmacies, etc.) among the locations stored in the database 110 with respect to the start location. The map routing server 108 then sends the output data back to the requesting computing device 100. Alternatively, the map routing service 106 (e.g., a partitioning component) is hosted on the computing device 100, and the computing device 100 need not communicate with a local area network 102.

To visualize and implement routing methods, it is helpful to represent locations and connecting segments as an abstract graph with vertices and directed edges. Vertices correspond to locations, and edges correspond to road segments between locations. The edges may be weighted according to the travel distance, transit time, and/or other criteria about the corresponding road segment. The general terms "length" and "distance" are used in context to encompass the metric by which an edge's weight or cost is measured. The length or distance of a path is the sum of the weights of the edges contained in the path. For manipulation by computing devices, graphs may be stored in a contiguous block of computer memory as a collection of records, each record representing a single graph node or edge along with associated data.

As described further herein, the map routing service 106 can perform graph partitioning and provide results to the graph partitioning problem on any graphs containing natural cuts (i.e., relatively sparse cuts close to denser areas), such as road networks, for example. The term "cut" is used herein to denote a set of edges that separates the graph into two or more regions. It is contemplated that graph partitioning as described herein may be used with applications other than map routing, e.g., applications associated with a graph containing natural cuts.

Given a graph G=(V,E) (i.e., a graph G consisting of V vertices and E edges), the graph partitioning problem is directed to finding a partition of V such that each subset (cell) contains no more than U nodes and the number of edges between cells is minimized, where U is an input parameter corresponding to the maximum size of any cell. The problem is known to be NP-hard. As described further herein, graph partitioning comprises filtering and assembly and is based on the notion of natural cuts.

Figure 2:
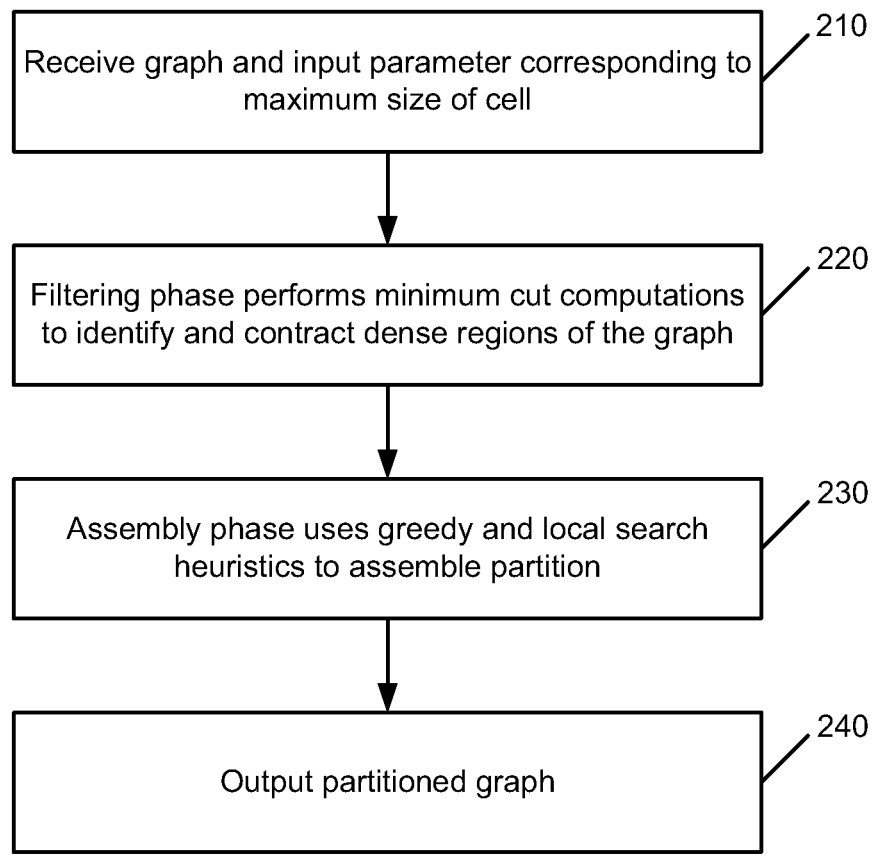
FIG. 2 is an operational flow of an implementation of a method which may be used in graph partitioning.

FIG. 2 is an operational flow of an implementation of a method 200 which may be used in graph partitioning. At 210, a graph and an input parameter are received, e.g., from storage and/or a user or system administrator. The input parameter corresponds to the maximum size of any cell of the partitioned graph.

At 220, a filtering phase performs a series of minimum cut computations to identify and contract dense regions of the graph. This reduces the size of the graph and preserves the general overall structure of the graph. The filtering keeps the edges that appear in natural cuts, and contracts other edges. It is noted that it is not enough to pick pairs of random vertices and run minimum cut computations between them because the average degree in road networks is small and thus a minimum cut between random vertices usually yields a trivial cut. Instead, in an implementation, minimum cuts are determined between chosen regions of the graph, as described further herein. Edges that do not contribute to a natural cut are contracted, reducing the graph size (e.g., by up to several orders of magnitude). Despite being much smaller, the contracted graph preserves the natural cuts.

In an implementation, in the filtering phase, as described further herein, cuts with one or two edges in the graph are identified and contracted to reduce the graph size. Next, natural cut computations are performed to identify and contract dense regions of the graph. In an implementation, a natural cut is detected by running a breadth-first search (BFS) and minimum cut combination. More precisely, in each iteration, a node v is picked as a center and a BFS tree T is grown from v, stopping when size (T) (the number of vertices in T) is about to exceed U (the input parameter corresponding to the maximum size of any cell). The set of neighbors of T is referred to as the ring of v. The core of v is the union of all nodes added to T before its size reaches U/10 (or U divided by any other user defined parameter, such as U/5 or U/20, for example). Both the core and the ring are temporarily contracted to a single node (each), and the minimum cut between them is determined. The edges that appear in natural cuts (which include bridges, mountain passes, underpasses, overpasses, border checkpoints, ferries, for example) are preserved. The other edges are contracted, thereby for example reducing a road network with tens of millions of nodes to a weighted graph with a few thousand nodes.

At 230, an assembly phase uses a combination of greedy and local search heuristics on the filtered graph to assemble the final partition. The assembly phase only tries to combine fragments (the contracted vertices). In an implementation, in the assembly phase, on the contracted graph, optimization methods may be run that obey the maximum cell size U, as described further herein. Hence, there is no need to do any rebalancing when uncontracting the input. The partitioned graph may be outputted (e.g., provided to the user and/or storage and/or an application for processing) at 240.

It is contemplated that the filtering techniques can be used with any assembly phase, and that the assembly phase can be used with any graph, not just the results of the filtering phase.

Figure 3:
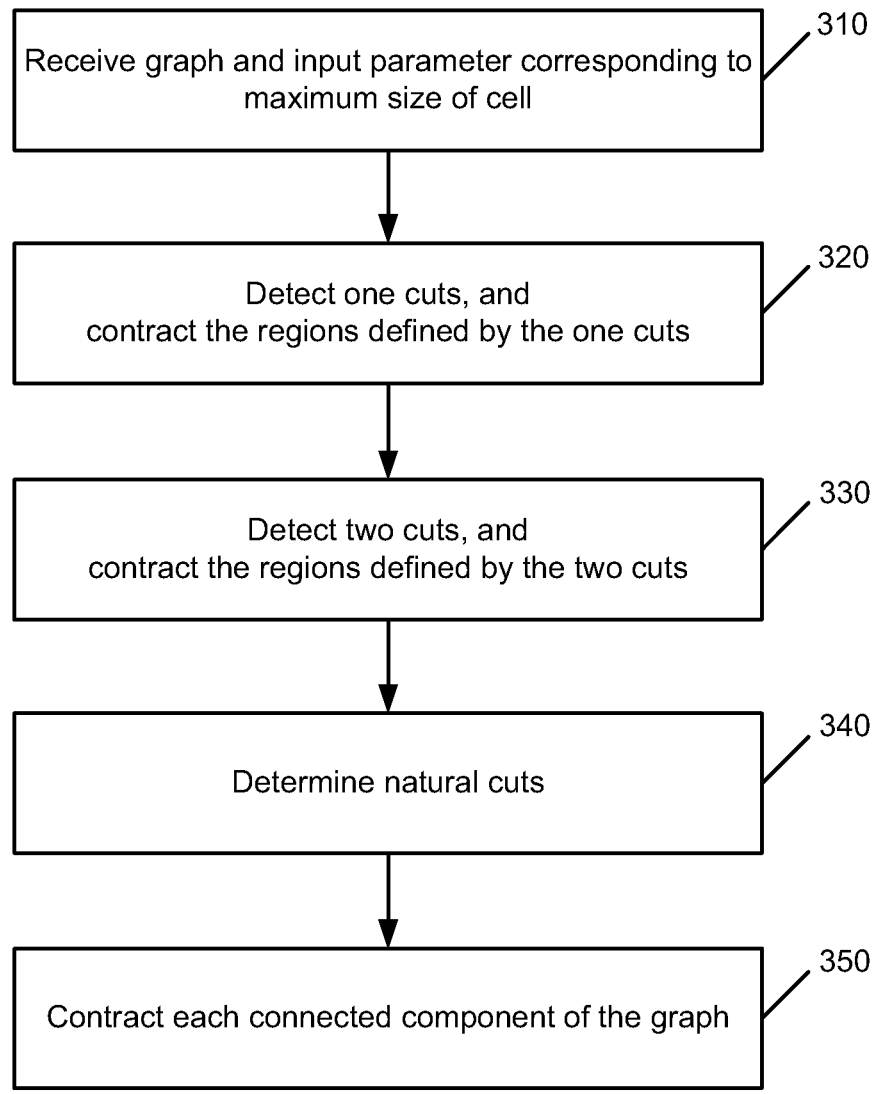
FIG. 3 is an operational flow of an implementation of a filtering method which may be used in graph partitioning.

FIG. 3 is an operational flow of an implementation of a filtering method 300 which may be used in graph partitioning. During filtering, dense regions of the graph are identified and contracted, thereby collapsing each dense region into a single vertex.

Figure 8:
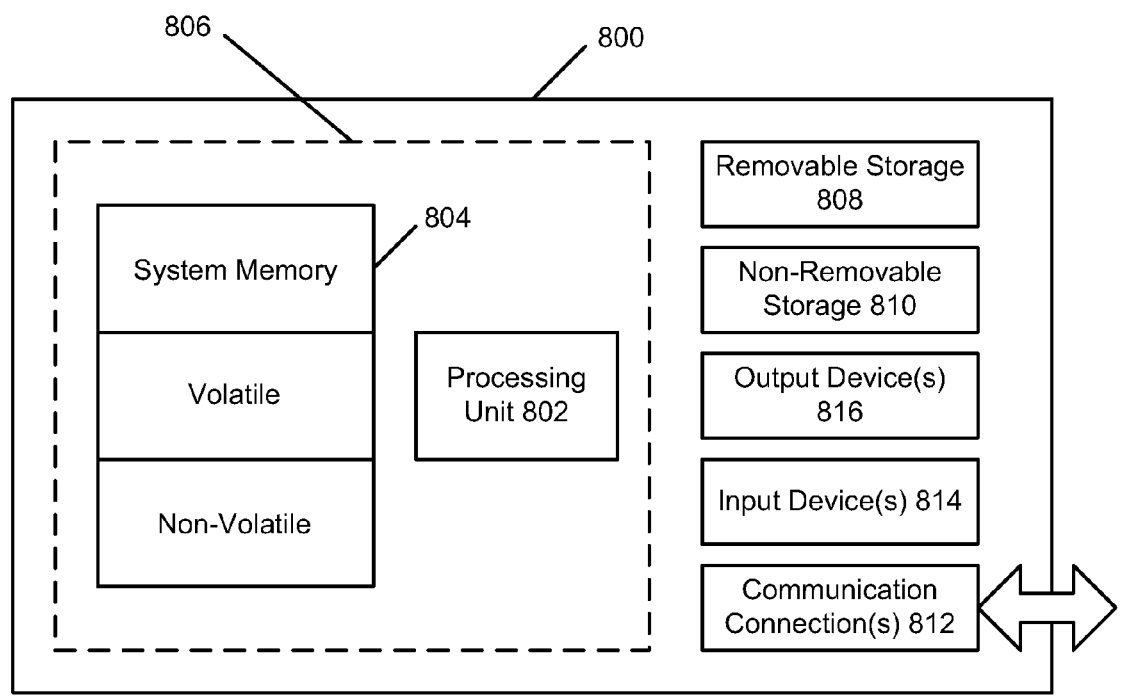
FIG. 8 shows an exemplary computing environment.

At 310, a graph is received, similar to that in 210, at the map routing service 106, for example, or a partitioning component or a computing device, an example of which is described with respect to FIG. 8. The graph may be denoted as G=(V,E), with input parameter U.

More precisely, the input to the partitioning problem is an undirected graph G=(V,E). Each vertex v∈V has a size s(v)>0, and each edge e={u,v}∈E has a weight w(e) (or, equivalently, w{u,v}). A cell size bound U is also provided. Take G to be connected, otherwise each connected component can be processed independently. By extension, the size s(C) of any set C⊂V is the sum of the sizes of its vertices, and the weight of a set F⊂E is the sum of the weights of its edges. A partition P={V1, V2, . . . , Vk} of V is a set of disjoint subsets (also called cells) such that $\cup_{i=1}^{k}$Vi=V. Any edge {u,v} with u∈Vi and v∉Vi is called a cut edge. Given a set S⊂V, let δ(S)={{u,v}:{u,v}∈E, u∈S, ∉S} be the set of edges with exactly one endpoint in S. The set of edges between cells in P is denoted by δ(P). The cost of P may be defined as the sum of the weights of its cut edges, i.e., cost(P)=w(δ(P)). The goal of the graph partitioning problem is to find a minimum-cost partition P={V1, V2, ..., Vk} such that the size of each cell is bounded by U.

Thus, upon receiving the graph and the input parameter, filtering may be performed. The filtering phase reduces the size of the input graph while preserving its sparse cuts. The filtering detects and contracts relatively dense areas separated by small cuts. The edges in these cuts are preserved while other edges are contracted. The filtering phase comprises multiple stages. A first stage (at 320 and 330) finds "tiny" cuts, i.e., cuts with exactly one or two edges (referred to as "one cuts" and "two cuts", respectively), and contracts some of the regions they define. The second stage (at 340) applies a randomized heuristic to find natural cuts, arbitrary cuts that are small relative to the neighboring areas of the graph.

More precisely, in an implementation for example, to contract vertices u and v, these two vertices are replaced with a new vertex x with $s(x)=s(u)+s(v)$. Moreover, for each edge {u,z} or {v,z} (with $z \notin \{u,v\}$), a new edge {x,z} is created with the same weight. If multiple edges are created (which happens when u and v share a neighbor), they are merged and their weights are combined. By extension, contracting a set of vertices means repeatedly contracting pairs of vertices in the set (in any order) until a single vertex remains. Similarly, contracting an edge means contracting its endpoints.

At 320, "one cuts" are detected and the regions they define are contracted. In other words, certain subgraphs of the graph are contracted in order to reduce its size.

Starting with the original graph (with $s,w \equiv 1$, for example), some of its vertices are contracted. In an implementation, a first pass, at 320, identifies all edge-connected components of the graph using depth-first search to form a tree T. T may be rooted by choosing as a root the edge-connected component with maximum size, which on road networks typically corresponds to most of the graph. T may then be traversed in a top-down fashion. As soon as a subtree S is entered of total size at most U, it is contracted into a single vertex, as FIG. 4 illustrates.

Figure 4:
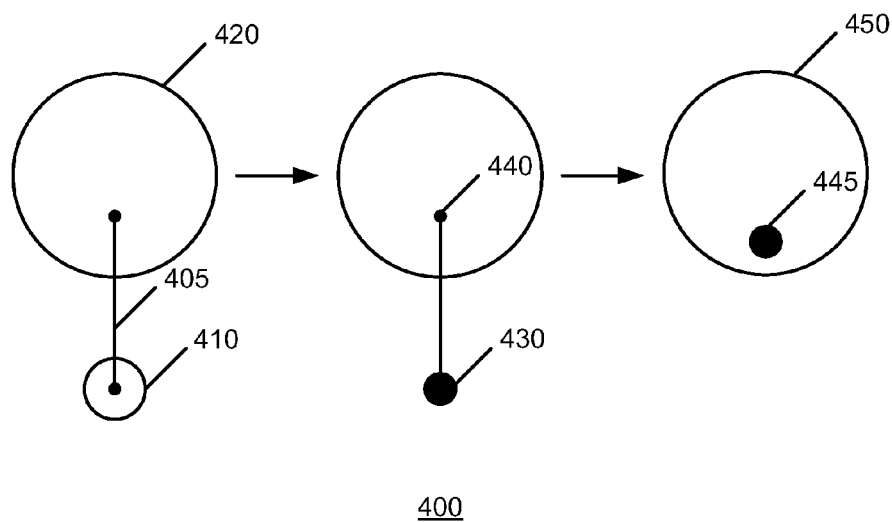
FIG. 4 is a diagram useful in explaining aspects of an implementation of a filtering method.

FIG. 4 is a diagram 400 showing the contraction of a one cut. As shown, a one cut 405 separates a component 410 (having less than a predetermined size) from the rest of the graph 420. The component 410 is then contracted into a single vertex 430. If the combined size of the vertex 430 and its neighbor 440 in the graph 420 is sufficiently small (e.g., less than a predetermined size), the vertex 430 may be contracted with the neighbor 440 to form a new vertex 445 in a graph 450. The contraction of component 410 into vertex 430 does not affect the optimum solution value: any solution that splits the subtree S in more than one cell can be converted (with no increase in cost) into one in which the subtree S defines a cell on its own. In an implementation, in order to further reduce the instance size, the newly contracted vertex 430 is merged with its neighbor 440 in the parent graph 420, as long as (1) the subtree has size at most set to a predetermined threshold (e.g., 3, 5, 10, etc.) and (2) the resulting merged vertex (e.g., vertex 445) has size at most U. This operation may affect the solution value, but is unlikely to.

In an implementation, during an additional pass over the graph, all vertices of degree two may be identified. They form paths, which are contracted unless their total size is bigger than U.

At 330, "two cuts" (i.e., cuts with exactly two edges) are detected and the regions defined by the two cuts are contracted. Any known technique for determining two cuts may be used. For example, suppose that on a certain iteration, a class $S \subset E$ is being examined, where S is a set of edges any two of which forms a two cut. First, the connected components of the graph $G_S=(V,E\backslash S)$ are determined, and then every component whose size is at most U is contracted, as FIG. 5 illustrates.

Figure 5:
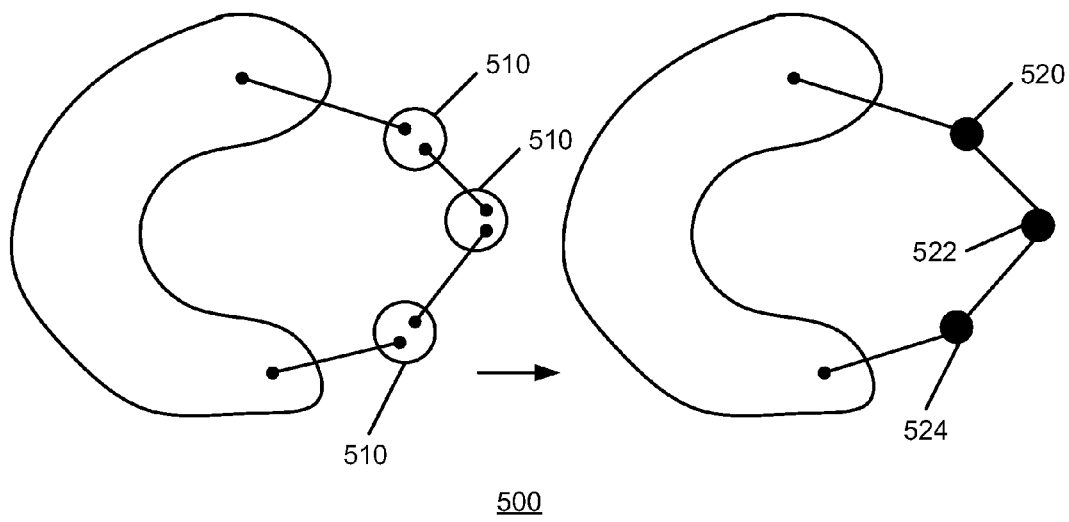
FIG. 5 is another diagram useful in explaining aspects of an implementation of a filtering method.

FIG. 5 is a diagram 500 showing the contraction of a two cut. Here, the set of edges in the same equivalence class determines a set of components 510. Each component 510 is contracted into a single vertex 520, 522, 524 (unless the component size exceeds U). In an implementation, two components at a time may be simultaneously traversed, stopping when the next-to-last component is fully visited. This takes time proportional to the sum of the sizes of all but the largest component (which typically contains almost the entire graph).

At 340, the natural cuts are determined, and each connected component of the graph is contracted at 350. Thus, contraction is performed via natural cut computations. Natural cuts do not have a preset number of edges. Intuitively, a natural cut is a sparse cut splitting a local region of the graph. In an implementation, the technique finds natural cuts throughout the graph, ensuring that every vertex is inside some such cut.

Cuts may be obtained by picking two vertices (s and t) within a local region and computing the minimum cut between them. However, since the average degree on a road network is small (e.g., lower than 3), such s-t cuts are usually trivial, with either s or t alone in its component. In an implementation, a minimum cut between sets of vertices may be computed. These cuts are non-trivial and can be computed by a standard s-t cut algorithm, such as the well known push-relabel method.

Figure 6:
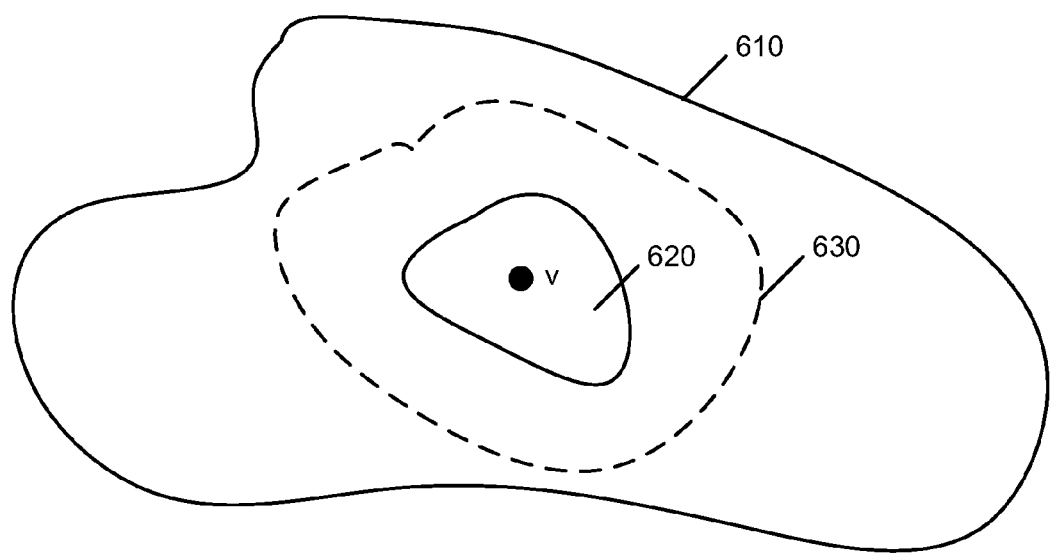
FIG. 6 is another diagram useful in explaining aspects of an implementation of a filtering method.

In an implementation, the technique may use iterations. In each iteration, a vertex v is selected as a center and a BFS tree T is grown from v, stopping when s(T) (the sum of its vertex sizes) reaches $\alpha U$, for some user-defined parameter $0 < \alpha \leq 1$. The set of neighbors of T in $V\backslash T$ is referred to as the ring of v. The core of v is the union of all vertices added to T before its size reached $\alpha U/f$, where $f>1$ is a second user-defined parameter. The core to a single vertex s and the ring into a single vertex t may be temporarily contracted and the minimum s-t cut between them may be computed, as shown in FIG. 6. FIG. 6 shows that for determining a natural cut, a BFS tree of size less than $\alpha U$ is grown from a center vertex v. The external neighboring vertices of this tree are the ring 610. The set of all vertices visited by the BFS while the tree had size less than $\alpha U/f$ is the core 620. The natural cut 630 is the minimum cut between the contracted versions of the core 620 and the ring 610.

The centers and the number of iterations are chosen to ensure that every vertex eventually belongs to at least one core, and is therefore inside at least one cut. This may be accomplished by picking v uniformly at random among all vertices that have not yet been part of any core. The process stops when there are no such vertices left. Note that this procedure can be repeated C* times in order to increase the number of marked edges, where C* (the coverage) is a user-defined parameter.

After these iterations are finished, each connected component of the graph $G_C=(V,E \backslash C)$ may be contracted, where C is the union of all edges cut by the process above. Each such contracted component is referred to as a fragment.

Note that setting $\alpha \leq 1$ ensures that no fragment in the contracted graph has a size greater than U. The transformed problem can therefore still be partitioned into cells of size at most U, and any such partition can be transformed into a feasible solution to the original instance. Parallelizing the natural cut heuristic may be performed by picking the centers sequentially and then running the min-cut computations in parallel.

Figure 7:
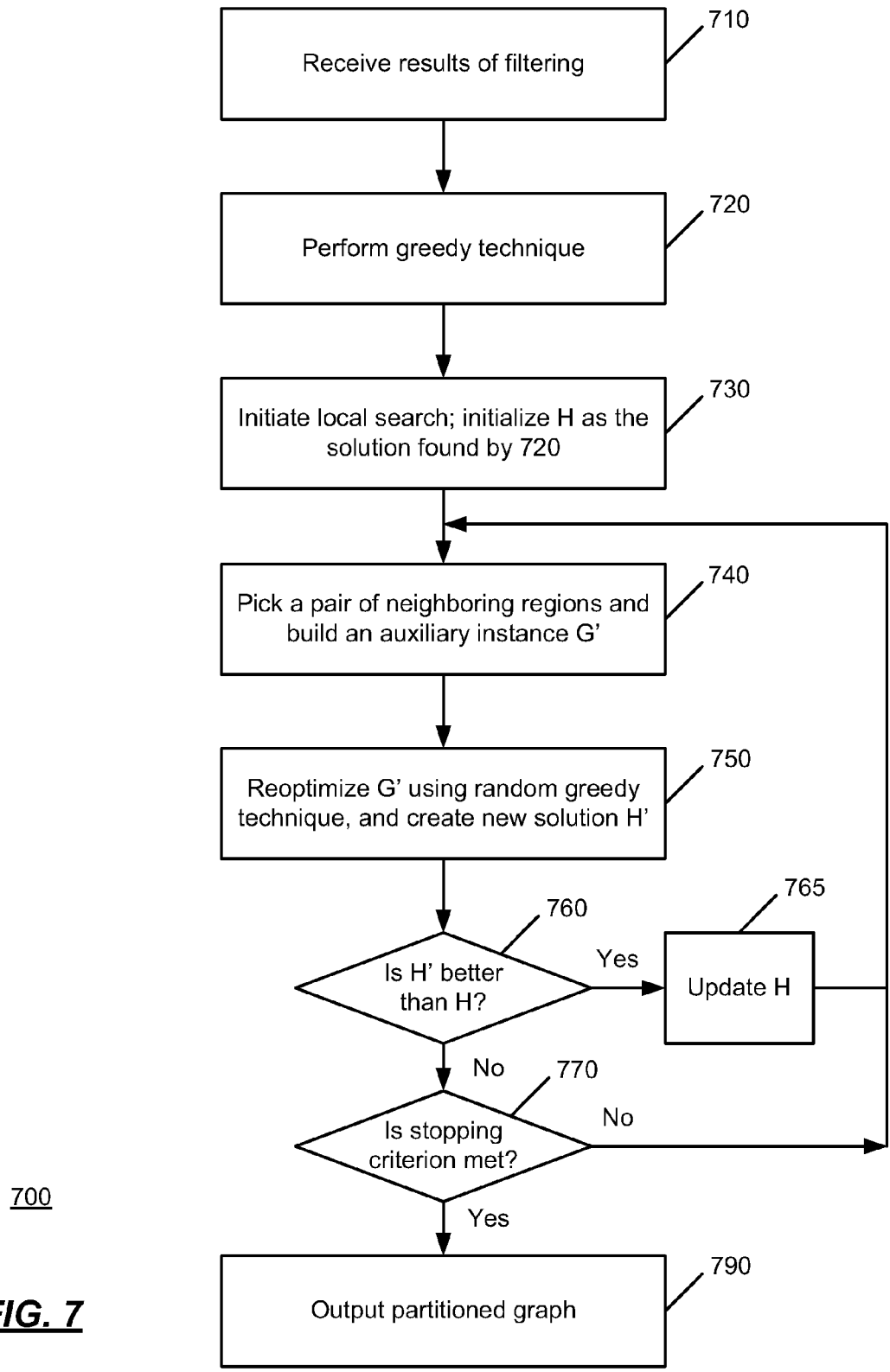
FIG. 7 is an operational flow of an implementation of an assembly method which may be used in graph partitioning.

After the filtering is complete, assembly is performed on the smaller graph that results from the filtering. FIG. 7 is an operational flow of an implementation of an assembly method 700 which may be used in graph partitioning. At 710, the results (e.g., the reduced graph) of the filtering phase are received.

At 720, a greedy technique is performed to combine well-connected small fragments to obtain an initial partition. In other words, to find a reasonably good initial partition, a greedy algorithm is used. It repeatedly contracts pairs of adjacent vertices, and stops when no new contraction can be performed without violating the size constraint.

In an implementation, in each step, the algorithm picks, among all pairs of adjacent vertices with combined size at most U, the pair {u,v} that minimizes a certain score function. This function is randomized and depends on the sizes of the two vertices and on the weight of the edge between them. Any score function may be used. In an implementation, an example score function is given by Equation (1):

$$\text{score}(\{u, v\}) = r \cdot \left( \frac{w\{u, v\}}{\sqrt{s(u)}} + \frac{w\{u, v\}}{\sqrt{s(v)}} \right) \quad (1)$$

where r is a random number between 0 and 1, biased towards 1 to ensure that in most cases the contribution of the deterministic term is not too small. For example, use two constants a and b, both between 0 and 1. With probability a, pick r uniformly at random in the range [0, b], and with probability 1−a, pick r uniformly at random from [b, 1]. Any values may be used. In an implementation, a=0.03 and b=0.6, though any values for a and b may be used.

Intuitively, the score function should ensure vertices are merged that are relatively small but tightly connected. The randomization term is relevant for the local search and the multistart heuristic, described further herein. For a fixed pair of vertices, the score function is determined once and stored. After each contraction, the function is recomputed for all edges adjacent to the contracted vertex, using a fresh random term.

Although greedy solutions are reasonable, they can be improved by local search. At 730, local search is performed. The local search views the current partition as a contracted graph H. Each vertex of H corresponds to a cell of the partition, and there is an edge {R,S} in H between cells R and S if there is at least one edge {u,v} in G with u∈R and v∈S. The weight of {R,S} in H is the sum of the weights of corresponding edges in G.

Any variant of local search may be used that comprises a sequence of reoptimization steps. Each such step first creates an auxiliary instance G'=(V',E') consisting of a connected subset of cells of the current partition. In this auxiliary instance, some of the original cells are uncontracted (i.e., decomposed into their constituent fragments in G (note that the cell is only uncontracted up to the fragments output by the filtering phase)), while others remain contracted. The weight of an edge in E' is given by the sum of the weights of the corresponding edges in G.

The randomized greedy algorithm (described above) is then run on G'. The solution on G' can then be used to create the modified solution H' in a natural way. If H' is better than H, make H' the new current solution, replacing H. Otherwise, this reoptimization step "failed", and the original solution H is retained.

The reoptimization operations may be repeated on several pairs of regions, improving the current solution with each iteration. More particularly, at 730, local search is initiated and H is initialized as the solution found by 720. At 740 a pair of neighboring regions is picked, and an auxiliary instance G' is built using the neighboring regions. At 750, G' is reoptimized using a random greedy technique to create a new solution H'.

If H' is better than H, as determined at 760, then H is updated with H' at 765 and processing continues at 740. If H' is not better than H, then it is determined at 770 if a stopping criterion has been met. If not, then processing continues at 740. Otherwise, the partitioned graph is outputted at 790.

Thus, after the reoptimization operations have been performed on the regions, the partitioned graph (H or H') is output at 790 (e.g., provided to a user, provided to storage, and/or provided to an application for processing).

Three local searches are described herein as examples and may be used in implementations, and differ in the rules they use to pick the auxiliary instances G'. The first example picks, in each step, a pair {R,S} of adjacent cells and creates an auxiliary instance $G'_{RS}$ consisting of their uncontracted versions. The second example is similar, but also includes in $G'_{RS}$ the (contracted) neighbors of R and S in H. The third example extends the second example by also uncontracting the neighbors of R and S.

Note that, for all the local search examples, each step is fully determined by a pair {R,S} of cells. The reoptimization step itself, however, is heuristic and randomized. In practice, it may be worth repeating it multiple times for the same pair {R,S}. Therefore, in an implementation, keep with each pair {R,S} of adjacent cells in the current partition a counter initially set to zero. The counter measures the number of unsuccessful reoptimization steps applied to {R,S}. If a reoptimization step on {R,S} fails, increment the counter. If it succeeds, reset to zero the counters associated with all edges in H' that have at least one endpoint in an uncontracted region of $G'_{RS}$.

In an implementation, the algorithm uses the counters, together with a user defined parameter φ≥1, to decide when to stop. The parameter limits the maximum number of allowed failures per pair. Among all pairs {R,S} with $\phi_{RS} < \phi$, the algorithm picks one uniformly at random for the next reoptimization step. If no such edge is available, the algorithm stops. Increasing φ usually leads to better solutions at the expense of increased running times.

In addition to using a greedy algorithm and a local search, the assembly phase may use a multistart heuristic with combination. In an implementation, the quality of the solutions may be improved by running a multistart heuristic. In each iteration, it runs the greedy algorithm and applies local search to it. Since both the greedy algorithm and the local search are randomized, different iterations tend to find distinct solutions. After M iterations (where M is an input parameter), the algorithm stops and returns the best solution found.

Better partitions can be obtained by combining pairs of solutions generated during the multistart algorithm. To do so, maintain a pool of elite solutions with capacity k, representing some of the best partitions found so far. Here k is a parameter of the algorithm; in an implementation, a value of k=⌈√M⌉, though any value of k may be used.

In the first k iterations of the multistart algorithm, add the resulting partition P to the pool. In subsequent iterations, before trying to add P to the pool, create another solution P' by combining two distinct solutions picked uniformly at random from the pool. Then combine P and P', obtaining a third solution P'''. Then try to insert P''', P', and P into the pool, in this order.

Regarding combining two solutions, let P1 and P2 be two partitions. The purpose of combining them is to obtain a third solution P3 that shares the good features of the original ones. Intuitively, if P1 and P2 "agree" that an edge (u,v) is on the boundary between two regions, then the edge should be more likely to be a boundary edge in P3.

More precisely, create a new instance G' with the same vertices and edges as G. For each edge e, define b(e) as the number of solutions (among P1 and P2) in which (u,v) is a boundary edge. The only possible values of b(e) are 0, 1, and 2. The weight w'(e) of e in G' is its original weight w(e) in G multiplied by a positive perturbation factor pb(e), which depends on b(e). Intuitively, to make P3 mimic P1 and P2, p0>p1>p2, since lower weight edges are more likely to end up in the boundary. The algorithm is not too sensitive to the exact choice of parameters; in an implementation p0=5, p1=3 and p2=2 (these are the smallest integral values such that pi<2pi+1), though any values may be used.

The standard combination of greedy algorithm and local search is used to find a solution of G', which is turned into a solution to G by restoring the original edge weights.

Regarding pool management, the purpose of the pool of solutions is to keep good solutions found by the algorithm. While the pool has fewer than k solutions, any request to add a new solution P is granted. If, however, the pool is already full, it is to be decided whether to actually add P or not and, if so, determine a solution to evict. If all solutions already in the pool are better than P, then do nothing. Otherwise, among all solutions that are no better than P, evict that one that is most similar to P. For this purpose, the difference between two solutions is defined as the cardinality of the symmetric difference between their sets of cut edges.

FIG. 8 shows an exemplary computing environment in which example implementations and aspects may be implemented. The computing system environment is only one example of a suitable computing environment and is not intended to suggest any limitation as to the scope of use or functionality.

Numerous other general purpose or special purpose computing system environments or configurations may be used. Examples of well known computing systems, environments, and/or configurations that may be suitable for use include, but are not limited to, PCs, server computers, handheld or laptop devices, multiprocessor systems, microprocessor-based systems, network PCs, minicomputers, mainframe computers, embedded systems, distributed computing environments that include any of the above systems or devices, and the like.

Computer-executable instructions, such as program modules, being executed by a computer may be used. Generally, program modules include routines, programs, objects, components, data structures, etc. that perform particular tasks or implement particular abstract data types. Distributed computing environments may be used where tasks are performed by remote processing devices that are linked through a communications network or other data transmission medium. In a distributed computing environment, program modules and other data may be located in both local and remote computer storage media including memory storage devices.

With reference to FIG. 8, an exemplary system for implementing aspects described herein includes a computing device, such as computing device 800. In its most basic configuration, computing device 800 typically includes at least one processing unit 802 and memory 804. Depending on the exact configuration and type of computing device, memory 804 may be volatile (such as random access memory (RAM)), non-volatile (such as read-only memory (ROM), flash memory, etc.), or some combination of the two. This most basic configuration is illustrated in FIG. 8 by dashed line 806.

Computing device 800 may have additional features/functionality. For example, computing device 800 may include additional storage (removable and/or non-removable) including, but not limited to, magnetic or optical disks or tape. Such additional storage is illustrated in FIG. 8 by removable storage 808 and non-removable storage 810.

Computing device 800 typically includes a variety of computer readable media. Computer readable media can be any available media that can be accessed by computing device 800 and include both volatile and non-volatile media, and removable and non-removable media.

Computer storage media include volatile and non-volatile, and removable and non-removable media implemented in any method or technology for storage of information such as computer readable instructions, data structures, program modules or other data. Memory 804, removable storage 808, and non-removable storage 810 are all examples of computer storage media. Computer storage media include, but are not limited to, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 800. Any such computer storage media may be part of computing device 800.

Computing device 800 may contain communications connection(s) 812 that allow the device to communicate with other devices. Computing device 800 may also have input device(s) 814 such as a keyboard, mouse, pen, voice input device, touch input device, etc. Output device(s) 816 such as a display, speakers, printer, etc. may also be included. All these devices are well known in the art and need not be discussed at length here.

It should be understood that the various techniques described herein may be implemented in connection with hardware or software or, where appropriate, with a combination of both. Thus, the processes and apparatus of the presently disclosed subject matter, or certain aspects or portions thereof, may take the form of program code (i.e., instructions) embodied in tangible media, such as floppy diskettes, CD-ROMs, hard drives, or any other machine-readable storage medium where, when the program code is loaded into and executed by a machine, such as a computer, the machine becomes an apparatus for practicing the presently disclosed subject matter.

Although exemplary implementations may refer to utilizing aspects of the presently disclosed subject matter in the context of one or more stand-alone computer systems, the subject matter is not so limited, but rather may be implemented in connection with any computing environment, such as a network or distributed computing environment. Still further, aspects of the presently disclosed subject matter may be implemented in or across a plurality of processing chips or devices, and storage may similarly be effected across a plurality of devices. Such devices might include PCs, network servers, and handheld devices, for example.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A method for graph partitioning, comprising:
receiving as input, at a computing device, a graph comprising a plurality of vertices and edges;
filtering the graph using a plurality of natural cuts, the natural cuts being relatively sparse cuts bordering denser regions of the graph, each of the natural cuts computed by using a breadth-first search to find a minimum cut between a first set of vertices in a first region and a second set of vertices surrounding the first region, the minimum cut being a relatively sparse cut defining the first region as a denser region of the graph, the filtering comprising preserving in an un-contracted state edges of the graph that correspond to the natural cuts and contracting regions that do not correspond to the natural cuts to generate a filtered graph, by the computing device, wherein the filtered graph comprises a plurality of cells corresponding to the contracted regions, each cell comprising a different subset of the vertices;
partitioning the graph by assembling the filtered graph to form a partitioned graph, the assembling comprising minimizing the number of edges between the cells using a greedy technique and a local search technique, by the computing device; and
outputting the partitioned graph.

2. The method of claim 1, wherein filtering the graph further comprises:
identifying a first plurality of cuts, each cut having exactly one edge splitting the vertices in the graph in two components; and
contracting the components induced by the first plurality of cuts to reduce the size of the graph.

3. The method of claim 2, wherein filtering the graph further comprises:
identifying a second plurality of cuts, each cut having exactly two edges splitting the vertices in the graph in two components; and
contracting the components induced by the second plurality of cuts to reduce the size of the graph.

4. The method of claim 1, wherein the graph represents a network of nodes.

5. The method of claim 1, wherein the graph represents a road map.

6. The method of claim 5, wherein the edges of the natural cuts correspond to s-t cuts of the road map.

7. The method of claim 1, further comprising receiving an input parameter corresponding to a maximum size of each of the cells.

8. The method of claim 7, wherein the greedy technique comprises repeatedly contracting pairs of adjacent vertices and stopping when no new contraction can be performed without violating a size constraint based on the input parameter.

9. The method of claim 1, wherein partitioning the graph by assembling the partitioned graph from the filtered graph to form the partitioned graph comprises only combining vertices that were contracted during the filtering.

10. A method for graph partitioning, comprising:
identifying a plurality of first cuts in a graph by a computing device, wherein the graph comprises a plurality of vertices and edges, each first cut having a predetermined number of edges linking vertices in the graph;
filtering the graph using a plurality of natural cuts, the natural cuts being relatively sparse cuts bordering denser regions of the graph, each of the natural cuts computed by using a breadth-first search to find a minimum cut between a first set of vertices in a first region and a second set of vertices surrounding the first region, the minimum cut being a relatively sparse cut defining the first region as a denser region of the graph, the filtering comprising preserving in an un-contracted state edges of the graph that correspond to the natural cuts and contracting regions that do not correspond to the natural cuts to generate a filtered graph, by the computing device, wherein the filtered graph comprises a plurality of cells corresponding to the contracted regions, each cell comprising a different subset of the vertices;
partitioning the graph by assembling the filtered graph to form a partitioned graph, the assembling comprising minimizing the number of edges between the cells using a greedy technique and a local search technique, by the computing device; and
outputting the filtered graph by the computing device.

11. The method of claim 10, wherein the predetermined number of edges is one or two.

12. The method of claim 10, wherein the edges of the natural cuts correspond to sparse regions of the graph.

13. The method of claim 12, wherein the graph represents a road map and wherein the edges of the natural cuts further correspond to separators of the road map.

14. A system comprising:
at least one computing device; and
a partitioning component adapted to:
receive a graph comprising a plurality of vertices and edges;
contract the vertices of the graph using a number of edges linking the vertices of the graph to generate a contracted graph; and
filter the contracted graph using a plurality of natural cuts, the natural cuts being relatively sparse cuts bordering denser regions of the graph, each of the natural cuts computed by using a breadth-first search to find a minimum cut between a first set of vertices in a first region and a second set of vertices surrounding the first region, the minimum cut being a relatively sparse cut defining the first region as a denser region of the graph, the filtering comprising preserving in an un-contracted state edges of the graph that correspond to the natural cuts and contracting regions that do not correspond to the natural cuts to generate a filtered graph, wherein the filtered graph comprises a plurality of cells corresponding to the contracted regions, each cell comprising a different subset of the vertices;
partition the graph by assembling the filtered graph to form a partitioned graph, the assembling comprising minimizing the number of edges between the cells using a greedy technique and a local search technique, by the computing device; and
output the filtered graph by the computing device.

15. The system of claim 14, wherein the partitioning component is further adapted to:
identify a first plurality of cuts, each cut having exactly one edge linking vertices in the graph, and contract the regions defined by the first plurality of cuts to reduce the size of the graph; and
identify a second plurality of cuts, each cut having exactly two edges linking vertices in the graph, and contract the regions defined by the second plurality of cuts to reduce the size of the graph.

* * * * *